United States Patent
Kelkar et al.

(10) Patent No.: US 11,251,261 B2
(45) Date of Patent: Feb. 15, 2022

(54) FORMING A BARRIER MATERIAL ON AN ELECTRODE

(71) Applicant: Micron Technology, Inc., Boise, ID (US)

(72) Inventors: Sanket S Kelkar, Boise, ID (US); An-Jen B. Cheng, Boise, ID (US); Dojun Kim, Boise, ID (US); Christopher W. Petz, Boise, ID (US); Matthew N. Rocklein, Boise, ID (US); Brenda D. Kraus, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/415,487

(22) Filed: May 17, 2019

(65) Prior Publication Data

US 2020/0365684 A1 Nov. 19, 2020

(51) Int. Cl.
*H01L 27/108* (2006.01)
*H01L 21/768* (2006.01)
*H01L 49/02* (2006.01)

(52) U.S. Cl.
CPC ........ *H01L 28/75* (2013.01); *H01L 21/76888* (2013.01); *H01L 27/10814* (2013.01); *H01L 27/10852* (2013.01)

(58) Field of Classification Search
CPC ............... H01L 28/60; H01L 28/75–92; H01L 21/76888; H01L 27/1085; H01L 27/10852; H01L 27/11502
See application file for complete search history.

(56) References Cited

U.S. PATENT DOCUMENTS

| | | | | |
|---|---|---|---|---|
| 5,994,775 A | * | 11/1999 | Zhao | H01L 23/485 257/751 |
| 6,037,235 A | * | 3/2000 | Narwankar | H01L 21/28185 438/396 |
| 6,060,755 A | * | 5/2000 | Ma | H01L 29/513 257/410 |
| 6,249,014 B1 | * | 6/2001 | Bailey | H01L 27/11502 257/295 |
| 6,271,136 B1 | * | 8/2001 | Shue | C23C 16/34 257/E21.17 |
| 6,284,646 B1 | * | 9/2001 | Leem | C23C 16/52 438/629 |
| 6,295,195 B1 | * | 9/2001 | Maejima | H01L 28/55 257/E21.009 |
| 6,368,954 B1 | * | 4/2002 | Lopatin | H01L 21/28562 257/E21.171 |
| 6,413,815 B1 | * | 7/2002 | Lai | H01L 21/76808 257/E21.011 |
| 6,559,499 B1 | * | 5/2003 | Alers | H01L 28/60 257/311 |

(Continued)

*Primary Examiner* — Maliheh Malek
(74) *Attorney, Agent, or Firm* — Brooks, Cameron & Huebsch, PLLC

(57) ABSTRACT

Methods, apparatuses, and systems related to forming a barrier material on an electrode are described. An example method includes forming a top electrode of a storage node on a dielectric material in a semiconductor fabrication sequence and forming, in-situ in a semiconductor fabrication apparatus, a barrier material on the top electrode to reduce damage to the dielectric material when ex-situ of the semiconductor fabrication apparatus.

9 Claims, 6 Drawing Sheets

(56) References Cited

U.S. PATENT DOCUMENTS

| | | | |
|---|---|---|---|
| 6,664,168 B1* | 12/2003 | Andideh | H01L 28/55 257/E21.009 |
| 6,699,749 B1* | 3/2004 | Lee | H01L 21/02071 257/E21.011 |
| 6,737,728 B1* | 5/2004 | Block | H01L 23/5223 257/296 |
| 6,794,284 B2* | 9/2004 | Vaartstra | C23C 16/34 257/E21.171 |
| 6,967,159 B2* | 11/2005 | Vaartstra | C23C 16/34 438/649 |
| 6,995,081 B2* | 2/2006 | Vaartstra | C23C 16/08 257/E21.171 |
| 7,034,353 B2* | 4/2006 | Thakur | H01L 28/82 257/309 |
| 7,101,756 B2* | 9/2006 | Thakur | H01L 28/84 438/255 |
| 7,451,653 B1* | 11/2008 | Sippola | G01L 9/0042 73/715 |
| 7,489,545 B2* | 2/2009 | Forbes | G11C 11/5671 365/185.03 |
| 7,521,356 B2* | 4/2009 | Ramaswamy | C23C 16/34 438/627 |
| 7,576,380 B2* | 8/2009 | Thakur | H01L 28/84 257/300 |
| 7,662,693 B2 | 2/2010 | Bhattacharyya | |
| 7,833,906 B2* | 11/2010 | Knapp | H01L 21/76856 438/680 |
| 7,875,529 B2 | 1/2011 | Forbes et al. | |
| 7,985,680 B2* | 7/2011 | Hasegawa | H01L 21/28088 438/681 |
| 7,989,864 B2* | 8/2011 | Thakur | G11C 11/404 257/300 |
| 8,274,777 B2 | 9/2012 | Kiehlbauch | |
| 8,686,389 B1* | 4/2014 | Wang | H01L 45/147 257/2 |
| 8,946,854 B2* | 2/2015 | Feng | H01L 23/5223 257/532 |
| 9,209,394 B2* | 12/2015 | Ode | H01L 45/04 |
| 9,455,403 B1* | 9/2016 | Lai | H01L 27/2463 |
| 10,177,152 B1* | 1/2019 | Sandhu | H01L 27/10852 |
| 10,354,989 B1* | 7/2019 | Billingsley | H01L 29/78642 |
| 2001/0020715 A1* | 9/2001 | Yamasaki | H01L 21/7687 257/310 |
| 2001/0041250 A1* | 11/2001 | Werkhoven | C30B 25/14 428/212 |
| 2002/0022334 A1* | 2/2002 | Yang | H01L 28/56 438/396 |
| 2002/0025650 A1* | 2/2002 | Thakur | H01L 28/84 438/398 |
| 2002/0063274 A1* | 5/2002 | Kanaya | H01L 28/57 257/310 |
| 2002/0084480 A1* | 7/2002 | Basceri | H01L 27/10852 257/306 |
| 2002/0094632 A1* | 7/2002 | Agarwal | H01L 21/31683 438/239 |
| 2002/0102826 A1* | 8/2002 | Shimamoto | H01L 28/60 438/575 |
| 2002/0192953 A1* | 12/2002 | Wang | H01L 21/76846 438/672 |
| 2003/0022436 A1* | 1/2003 | Zheng | H01L 28/40 438/244 |
| 2003/0129309 A1* | 7/2003 | Otsuki | C23C 16/4412 427/255.28 |
| 2003/0132470 A1* | 7/2003 | Joshi | H01L 23/642 257/295 |
| 2003/0161952 A1* | 8/2003 | Wang | C23C 16/02 427/255.392 |
| 2003/0199139 A1* | 10/2003 | Lee | H01L 28/40 438/240 |
| 2003/0213987 A1* | 11/2003 | Basceri | H01L 28/40 257/296 |
| 2003/0232497 A1* | 12/2003 | Xi | H01L 28/75 438/627 |
| 2004/0099893 A1* | 5/2004 | Martin | H01L 27/11507 257/295 |
| 2004/0113235 A1* | 6/2004 | Coolbaugh | H01L 21/76807 257/532 |
| 2004/0125541 A1* | 7/2004 | Chung | H01G 4/228 361/306.3 |
| 2004/0126964 A1* | 7/2004 | Park | H01L 28/91 438/253 |
| 2004/0130032 A1* | 7/2004 | Gronbeck | H01L 23/53295 257/759 |
| 2004/0137728 A1* | 7/2004 | Gallagher | H01L 23/5222 438/689 |
| 2004/0142557 A1* | 7/2004 | Levy | C23C 16/45534 438/680 |
| 2004/0266126 A1* | 12/2004 | Lee | H01L 28/75 438/396 |
| 2006/0175289 A1* | 8/2006 | Jung | H01L 21/32134 216/57 |
| 2006/0182885 A1* | 8/2006 | Lei | H01L 21/0234 427/248.1 |
| 2006/0231880 A1* | 10/2006 | Yamakawa | H01L 28/57 257/306 |
| 2006/0240679 A1* | 10/2006 | Lee | H01L 28/75 438/785 |
| 2006/0261376 A1* | 11/2006 | Forbes | H01L 27/11568 257/216 |
| 2006/0261441 A1* | 11/2006 | Marsh | H01L 21/76871 257/532 |
| 2006/0289848 A1* | 12/2006 | Dennison | H01L 45/06 257/3 |
| 2007/0096221 A1* | 5/2007 | Frohberg | H01L 23/53238 257/383 |
| 2007/0257370 A1* | 11/2007 | Lee | H01L 27/10852 257/758 |
| 2008/0042134 A1* | 2/2008 | Jung | H01L 27/124 257/59 |
| 2008/0132061 A1* | 6/2008 | Luoh | H01L 21/28556 438/653 |
| 2008/0182410 A1* | 7/2008 | Elers | C23C 16/4554 438/685 |
| 2008/0254617 A1* | 10/2008 | Adetutu | H01L 21/76873 438/643 |
| 2009/0146256 A1* | 6/2009 | Eto | H01L 28/91 257/532 |
| 2010/0301436 A1* | 12/2010 | Sashida | H01L 21/76877 257/421 |
| 2011/0031462 A1* | 2/2011 | Jedema | H01L 45/1293 257/4 |
| 2012/0112259 A1* | 5/2012 | Cremer | H01L 28/75 257/296 |
| 2012/0199980 A1* | 8/2012 | Pfuetzner | H01L 21/76844 257/774 |
| 2012/0269962 A1* | 10/2012 | Blomberg | C23C 16/34 427/126.3 |
| 2015/0061042 A1* | 3/2015 | Cheng | H01L 21/823842 257/412 |
| 2016/0163838 A1* | 6/2016 | Miyamae | H01L 21/02164 438/104 |
| 2017/0084680 A1* | 3/2017 | Lin | H01L 21/02194 |
| 2017/0110601 A1* | 4/2017 | Blomberg | H01L 31/032 |
| 2017/0186752 A1* | 6/2017 | Choi | H01L 28/91 |
| 2017/0194204 A1* | 7/2017 | Sowa | H01L 23/528 |
| 2017/0330931 A1* | 11/2017 | Cheng | H01L 23/5223 |
| 2018/0096884 A1* | 4/2018 | Shank | H01L 21/76286 |
| 2018/0322994 A1* | 11/2018 | Rahman | H01L 27/222 |
| 2019/0043952 A1* | 2/2019 | Thomas | G06N 10/00 |
| 2019/0157156 A1* | 5/2019 | Chen | H01L 21/02211 |
| 2019/0280095 A1* | 9/2019 | Chen | H01L 21/28229 |
| 2019/0304790 A1* | 10/2019 | Mousa | H01L 21/0228 |
| 2019/0312035 A1* | 10/2019 | Takuma | H01L 27/11529 |
| 2019/0322812 A1* | 10/2019 | Wojtecki | C08G 79/04 |
| 2019/0371660 A1* | 12/2019 | Kuo | H01L 21/28556 |
| 2019/0371675 A1* | 12/2019 | Tsai | H01L 21/82345 |
| 2020/0006469 A1* | 1/2020 | Shih | H01L 23/5223 |

(56) References Cited

U.S. PATENT DOCUMENTS

| | | | |
|---|---|---|---|
| 2020/0013625 A1* | 1/2020 | Li | H01L 21/28556 |
| 2020/0052203 A1* | 2/2020 | Trinh | H01L 45/148 |
| 2020/0098985 A1* | 3/2020 | Trinh | H01L 45/146 |
| 2020/0126844 A1* | 4/2020 | Panda | H01L 21/67184 |
| 2020/0144065 A1* | 5/2020 | Lin | H01L 21/28556 |
| 2020/0176557 A1* | 6/2020 | Yin | H01L 28/92 |
| 2020/0181770 A1* | 6/2020 | Longrie | H01L 21/02274 |
| 2020/0235199 A1* | 7/2020 | Ho | H01L 21/0228 |
| 2020/0251334 A1* | 8/2020 | Fabreguette | H01L 21/0245 |
| 2020/0266210 A1* | 8/2020 | Economy | H01L 21/76831 |
| 2021/0005732 A1* | 1/2021 | Economy | H01L 29/4966 |
| 2021/0020569 A1* | 1/2021 | Parikh | H01L 21/76831 |
| 2021/0050409 A1* | 2/2021 | Rocklein | H01L 21/02252 |
| 2021/0062330 A1* | 3/2021 | Xu | C23C 16/04 |
| 2021/0066309 A1* | 3/2021 | Panda | H01L 21/76855 |
| 2021/0074805 A1* | 3/2021 | Lin | H01L 28/91 |

* cited by examiner

FORMING A BARRIER MATERIAL ON AN ELECTRODE

TECHNICAL FIELD

The present disclosure relates generally to semiconductor devices and methods, and more particularly to forming a barrier material on an electrode to reduce oxidation of the electrode.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

Figure 1A:
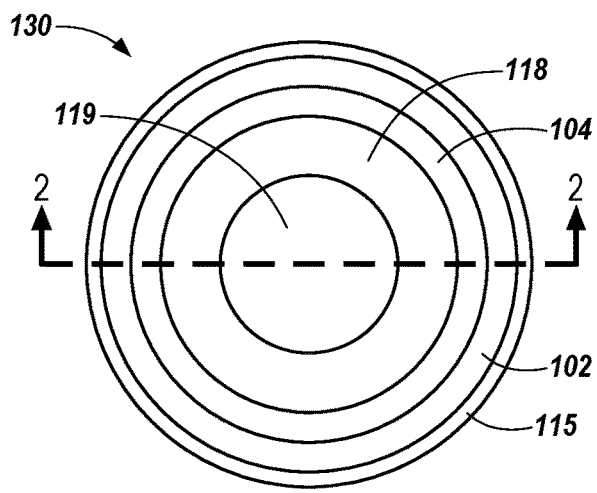
FIGS. 1A-1C illustrate example cross-sectional top-down views of storage nodes including a barrier material formed on electrodes of the storage nodes in accordance with a number of embodiments of the present disclosure.

Various types of memory devices, including arrays of volatile and/or non-volatile memory cells (e.g., a memory array), can include thin electrodes, e.g., a top electrode to a capacitor structure. For example, a top electrode can be approximately twenty angstroms thick. Thin electrodes can be especially susceptible to oxidation between semiconductor fabrication sequences when the electrodes may be out of, i.e., "ex-situ", a controlled gas environment of a semiconductor fabrication apparatus, e.g., outside of a vacuum chamber and exposed to air. To reduce negative effects of subsequent steps of a fabrication process on materials underlying an electrode and/or reduce oxidation of an electrode, at least one embodiment of the present disclosure includes forming a barrier material on an electrode. Forming a barrier material on a top electrode is used herein as an illustrative example. However, embodiments of the present disclosure are not so limited. For example, at least one embodiment can include forming a barrier material on a bottom electrode.

In at least one embodiment, the barrier can have a higher electrical resistivity (lower electrical conductivity) than the electrode such that electrical conduction through the electrode may be less than through the electrode material alone. However, electrical conduction through the barrier material may be less than electrical conduction through an oxide material formed on the electrode as a result of oxidation of the electrode resulting in a net improvement in electrical conductivity over the effects of oxidation.

Fabrication of semiconductor structures, such as storage nodes of a memory device, can involve moving semiconductor wafers, upon which semiconductor structures are being formed, in, i.e., "in-situ", and out of, "ex-situ", a vacuum environment according to a particular semiconductor fabrication sequence. This may include using multiple semiconductor chambers to perform various semiconductor fabrication sequences. A semiconductor wafer, and semiconductor structures formed thereon, may be transported between different semiconductor fabrication apparatuses during a semiconductor fabrication sequence. During transport between semiconductor fabrication apparatuses, the semiconductor structures may be exposed to the ambient environment (e.g., oxygen, moisture, and other elements in air), which may cause exposed surfaces of metal materials (e.g., a top electrode) to oxidize.

Oxidization of the exposed surfaces may result in an oxide material (e.g., a metal oxide material) to be formed on the exposed surfaces. The oxide material may have a higher electrical resistivity (lower electrical conductivity) than the un-oxidized metal material such that electrical conduction through the metal material is inhibited by the oxide formed on the metal material. Thus, oxidization of metal material may negatively affect the performance and/or operation of a resultant semiconductor device. However minimal, the time that a semiconductor structure is in transport ex-situ may become important. Thus tight processing sequence windows may be used to avoid oxidation.

Memory devices can include thin layers of metal materials that serve as components of a storage node, e.g., a top electrode of a capacitor structure. For example, in certain architectures, a capacitor cell of a DRAM device can include a top electrode comprising a metal material that is twenty angstroms or less thick. For example, a two to three angstroms thick layer of an oxide material formed on a twenty angstroms thick layer of a metal material may significantly inhibit electrical conduction through the metal material.

At least one embodiment of the present disclosure includes forming a top electrode of a storage node on a dielectric material in a semiconductor fabrication sequence and forming, in-situ in a semiconductor processing apparatus, a barrier material on the top electrode to reduce oxidation of the top electrode when ex-situ of the semiconductor fabrication apparatus. Forming the barrier material in-situ in a semiconductor fabrication apparatus can reduce, or eliminate, the risk of oxidation of the top electrode. While in the semiconductor fabrication apparatus, the top electrode may not be exposed to oxygen. For example, the top electrode may remain in a gas controlled chamber, in-situ, sealed off from the ambient environment and oxygen may not be present or in use to form the top electrode or the barrier material. The barrier material provides a barrier to oxygen, moisture, and/or other elements that may be ex-situ the semiconductor processing apparatus, thereby reducing the risk of damage to materials underlying a top electrode and/or an oxide material forming on the top electrode due to oxidation of the top electrode.

It is noted, that while the present disclosure discusses, for example illustration, a process in reference to a top electrode of a storage node in the form of a capacitor cell in the context of a DRAM memory array, embodiments are not limited to this example structure, circuitry, or device formation in a semiconductor fabrication sequence. Embodiments can cover forming a barrier material on other semiconductor components, such as access lines (e.g., wordlines), sense lines (e.g., digit lines, bit lines, etc.), or otherwise conductive surfaces, and devices produced therefrom, formed according to the techniques described herein.

Additionally, or alternatively, as design rules shrink, the chemistries used in a semiconductor fabrication sequence for forming other semiconductor structures in order to form a semiconductor device, e.g., subsequent to formation of a top electrode, may damage a dielectric material underlying the top electrode. The top metal material of the top electrode can comprise grains at a particular surface of the top electrode. Gaps between grain boundaries of a metal material may provide diffusion paths through the metal material for gases and liquids used in subsequent semiconductor fabrication sequences to the underlying dielectric material. For example, chlorine species may attack the dielectric material. Forming a barrier material in-situ on a top electrode as described herein can reduce, or even eliminate, damage to an underlying dielectric material resulting from chemistries used in subsequent semiconductor fabrication sequences. In at least one embodiment, the barrier material can, at least partially, fill in gaps between grain boundaries of the metal material of the top electrode. In at least one embodiment, the barrier material can amorphize a surface of the top electrode upon which the barrier material is formed. As such, diffusion paths through which gases and liquids used in subsequent semiconductor fabrication sequences may have been able to reach an underlying dielectric material are blocked off, thereby protecting the underlying dielectric material.

The present disclosure includes methods, apparatuses, and systems related to forming a barrier material on a top electrode to reduce oxidation of the top electrode when ex-situ of a semiconductor fabrication apparatus. An example of a method described herein includes forming a top electrode of a storage node on a dielectric material in a semiconductor fabrication sequence and forming, in-situ in a semiconductor fabrication apparatus, a barrier material on the top electrode to reduce oxidation of the top electrode when ex-situ of the semiconductor fabrication apparatus.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something can refer to one or more such things. For example, a number of capacitors can refer to at least one capacitor.

The figures herein follow a numbering convention in which the first digit or digits correspond to the figure number of the drawing and the remaining digits identify an element or component in the drawing. Similar elements or components between different figures may be identified by the use of similar digits. For example, reference numeral 104 may reference element "04" in FIG. 1A, and a similar element may be referenced as 204 in FIG. 2. Multiple analogous elements within one figure may be referenced with a reference numeral followed by a hyphen and another numeral or a letter. For example, 115-1 may reference element 15-1 in FIG. 1C and 115-2 may reference element 15-2, which can be analogous to element 115-1. Such analogous elements may be generally referenced without the hyphen and extra numeral or letter. For example, elements 115-1 and 115-2 or other analogous elements may be generally referenced as 115.

Figure 1B:
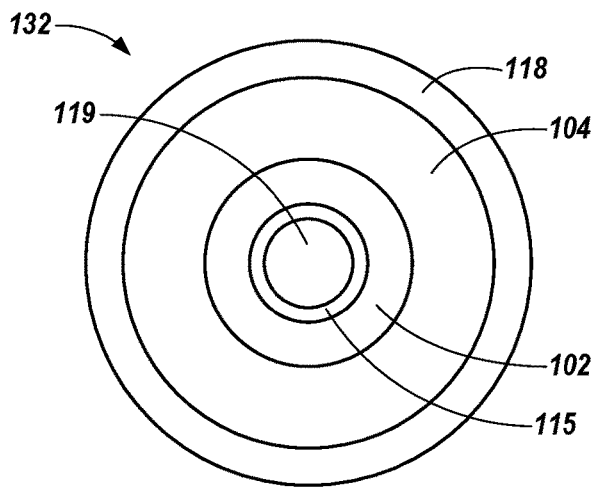
Figure 1C:
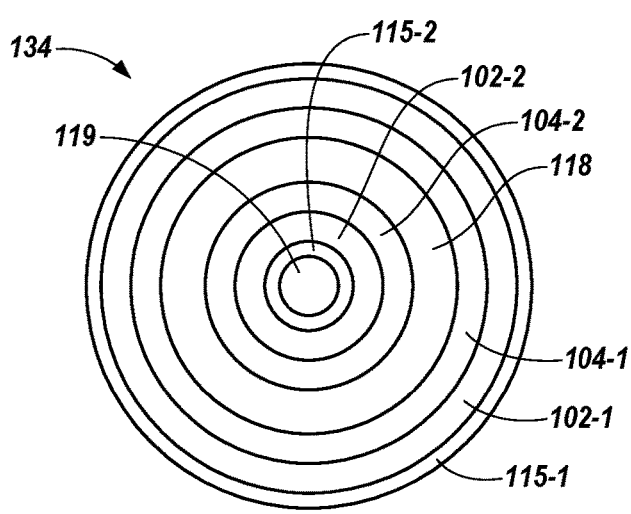

FIGS. 1A-1C illustrate example cross-sectional views of storage nodes 130, 132, and 134 including a barrier material 115 formed on an electrode 102 of the storage node 130, 132, and 134 in accordance with a number of embodiments of the present disclosure. FIGS. 1A-1C illustrate the storage nodes 130, 132, and 134 as capacitors 130, 132, and 134 including the barrier material 115. However, embodiments of the present disclosure are not limited to capacitors as storage nodes.

FIG. 1A illustrates a single-sided capacitor 130 in which a bottom electrode 118 can be formed in contact with a fill material 119. Non-limiting examples of the fill material 119 include polysilicon, silicon nitride, titanium nitride, tungsten, and doped versions thereof. A dielectric material 104 can be formed in contact with the bottom electrode 118. A non-limiting example of the dielectric material 104 is a zirconium oxide material. The top electrode 102 can be formed in contact with the dielectric material 104. Non-limiting examples of the top electrode 102 can include a platinum (Pt) material, a ruthenium (Ru) material, a titanium nitride (TiN) material, a tungsten (W) material, a molybdenum (Mo) material, a tantalum nitride (TaN) material, an aluminum (Al) material, a rhodium (Rh) material, a tungsten nitride (WN) material, and a ruthenium oxide (RuO) material.

The barrier material 115 is formed in contact with the top electrode 102. Formation of the barrier material 115 is described further in association with FIGS. 4-5C. Non-limiting examples of the barrier material 115 can include a silicide material, a nitride material, a boride material, an aluminide material, a carbide material, a tungsten material, a combinations and/or alloys thereof. In at least one embodiment, the barrier material 115 can include a binary nitride material such as a silicon nitride (SiN) material, a boron nitride (BN) material, a zirconium nitride (ZrN) material, a hafnium nitride (HfN) material, a germanium nitride (GeN) material, a tungsten nitride (WN) material, an aluminum nitride (AlN) material, a tantalum nitride (TaN) material, and a gallium nitride (GaN) material. In at least one embodiment, the barrier material 115 can include a ternary nitride material such as a tungsten silicon nitride (WSiN) material, a titanium silicon nitride (TiSiN) material, a tungsten carbon nitride material (WCN), and a tungsten boron nitride (WBN) material.

In at least one embodiment, the barrier material 115 can include a binary carbide material such as a titanium carbide (TiC) material, a tungsten carbide (WC) material, and an aluminum carbide (AlC) material. In at least one embodiment, the barrier material 115 can include a titanium aluminum carbon nitride (TiAlCN) material.

FIG. 1B illustrates a single-sided capacitor 132 in which a bottom electrode 118 can be formed in contact with a dielectric material 104. A top electrode 102 can be formed in contact with the dielectric material 104. The barrier material 115 can be formed in contact with the top electrode 102. A fill material 119 can be formed in contact with the barrier material 115.

FIG. 1C illustrates a double-sided capacitor 134 in which an inner barrier material 115-2 can be formed in contact with a fill material 119. The inner barrier material 115-2 can be formed in contact with an inner top electrode 102-2. An inner dielectric material 104-2 can be formed in contact with the inner top electrode 102-2 and a bottom electrode 118. An outer dielectric material 104-1 can be formed in contact with the bottom electrode 118 and an outer top electrode 102-1. An outer barrier material 115-2 can be formed in contact with the outer top electrode 102-1.

FIGS. 1A-1C show the capacitors 130, 132, and 134 having circular cross-sections; however, embodiments of the present disclosure are not so limited. For example, the capacitors 130, 132, and 134 can have square, rectangular, or other polygonal cross-sections. Any one of the capacitors 130, 132, and 134 can be a storage node of a memory cell. For example, a memory device can include an array of memory cells including an array of the capacitors 130, 132, and/or 134. The dielectric material 104 can be a storage node material of the storage node.

Figure 2:
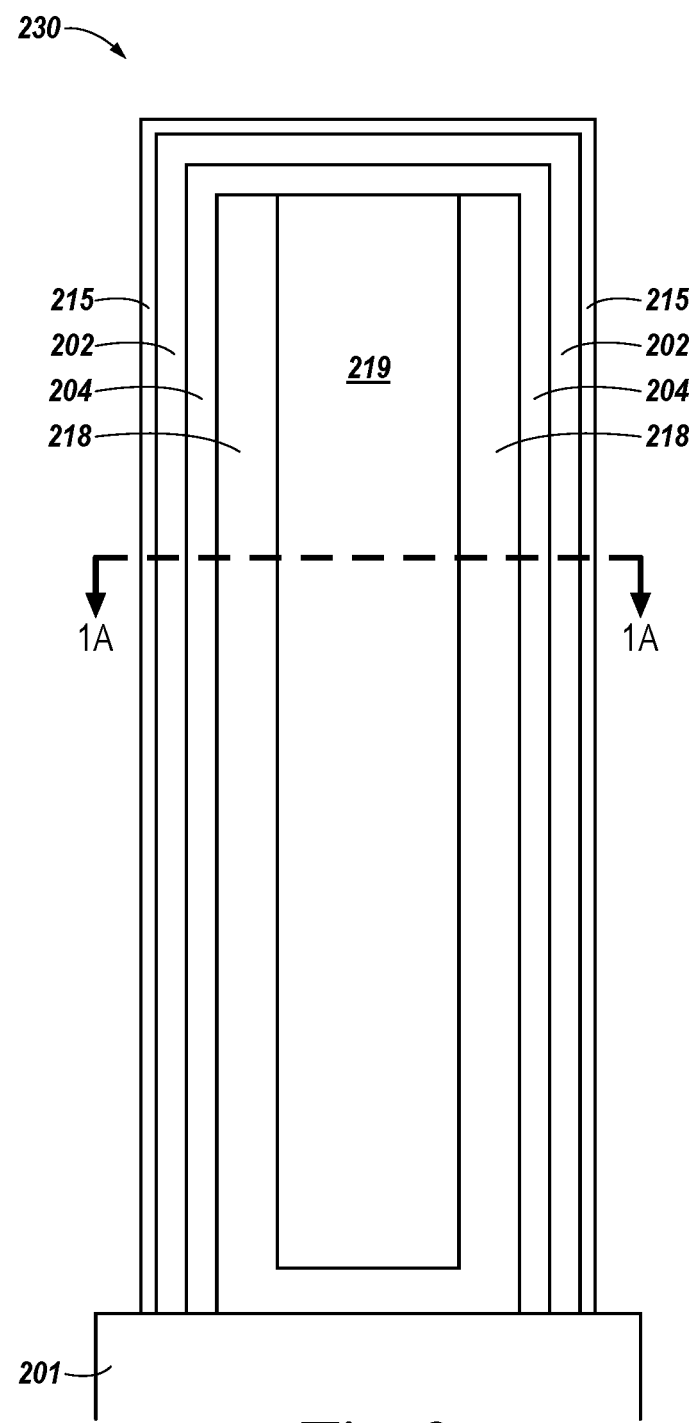
FIG. 2 illustrates an example cross-sectional side view of the storage node illustrated in FIG. 1A taken along cut line 2-2.

FIG. 2 illustrates an example cross-sectional side view of the storage node 130 illustrated in FIG. 1A taken along cut line 2-2. The capacitor 230 and components thereof can be analogous to the capacitor 130 and components thereof illustrated in FIG. 1. FIG. 2 illustrates a cross-sectional view of the capacitor 130 along the cut line 2-2 illustrated in FIG. 1A. Conversely, FIG. 1A illustrates a cross-sectional view of the capacitor 230 along the cut line 1A-1A illustrated in FIG. 2.

As illustrated in FIG. 2, the capacitor 230 can include the bottom electrode 218 and can be formed in contact with a substrate material 201. The fill material 219 can be formed within a cavity formed by the bottom electrode 218. The dielectric material 204 can be formed in contact with the bottom electrode 218 and the fill material 219. The top electrode 202 can be formed in contact with the dielectric material 204. The barrier material 215 can be formed in contact with the top electrode 202. Formation of the barrier material 215 is described further in association with FIGS. 3-5C.

Figure 3:
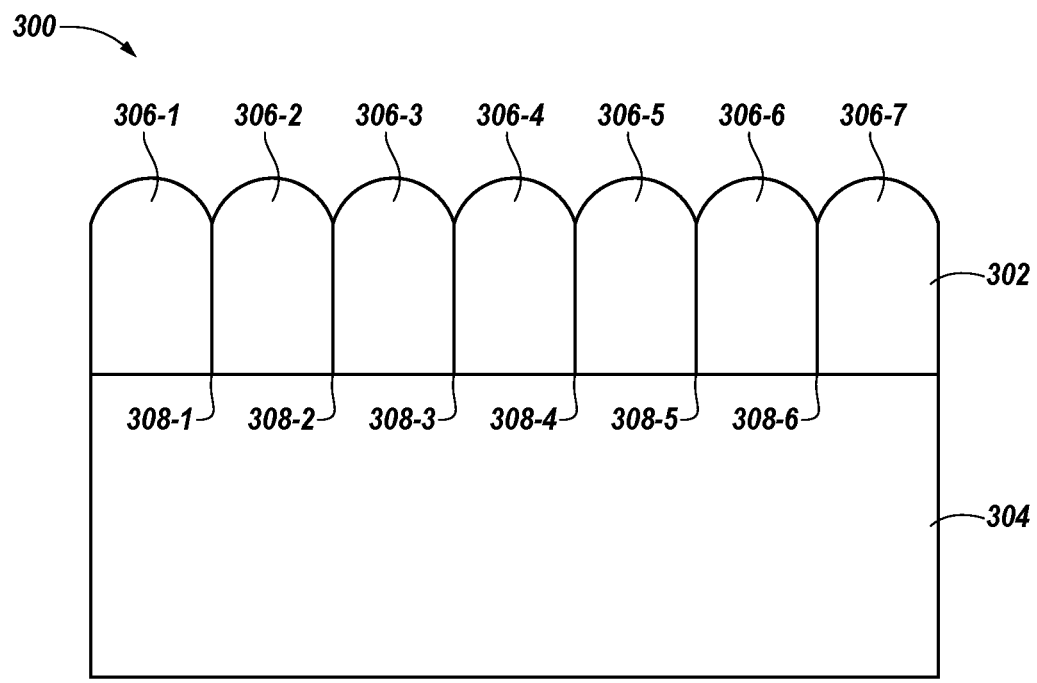
FIG. 3 illustrates a cross-sectional view of a working surface of a semiconductor structure at a point in time in a semiconductor fabrication sequence in accordance with a number of embodiments of the present disclosure.

FIG. 3 illustrates a cross-sectional view of a working surface of a semiconductor structure 300 at a point in time in a semiconductor fabrication sequence in accordance with a number of embodiments of the present disclosure. The semiconductor structure 300 includes a top electrode 302 is formed on a dielectric material 304. The top electrode 302 includes grains 306-1, 306-2, 306-3, 306-4, 306-5, 306-6, and 306-7 (collectively referred to as the grains 306). Between two of the grains 306 is a gap between the grain boundaries of the two grains. FIG. 3 illustrates a gap 308-1 between the grain boundaries of the grains 306-1 and 306-2, a gap 308-2 between the grain boundaries of the grains 306-2 and 306-3, a gap 308-3 between the grain boundaries of the grains 306-3 and 306-4, a gap 308-4 between the grain boundaries of the grains 306-4 and 306-5, a gap 308-5 between the grain boundaries of the grains 306-5 and 306-6, and a gap 308-7 between the grain boundaries of the grains 306-6 and 306-7 (collectively referred to as the gaps 308).

One or more semiconductor fabrication sequence subsequent to forming the top electrode 302 on the dielectric material 304 may be performed in a different semiconductor fabrication apparatus than the semiconductor fabrication apparatus in which the top electrode 302 is formed on the dielectric material 304. As a result, the top electrode 302 may be exposed, ex-situ, to oxygen during transport between the two semiconductor fabrication apparatuses. As a result of being unprotected, the top electrode may oxidize during transport between the two semiconductor fabrication apparatuses.

An oxide material (not shown in FIG. 3) may form on the top electrode as a result of oxidation. The oxide material may have a higher electrical resistivity (lower electrical conductivity) than the top electrode so that the oxide material inhibits electrical conduction through the top electrode. The increased resistance of the oxide material can affect the operation and/or performance of the semiconductor structure 300. For example, timing issues may occur because electric signals may take longer to conduct through the top electrode 302 and the oxide material than intended. As described in association with FIG. 1A-2, the dielectric material 304 and the top electrode 302 can be components of memory cells, such as a capacitor. The increased resistance of the oxide material can adversely affect the capacitance of a capacitor of a memory cell including the top electrode 302 and the dielectric material 304.

To reduce the risk of oxidation of the top electrode 302, some previous approaches include reducing queue time between forming the top electrode 302 on the dielectric material 304 in a first semiconductor fabrication apparatus and a subsequent processing step performed in a second semiconductor fabrication apparatus. However, tight time constraints may complicate the fabrication of a semiconductor device. Non-limiting examples of a queue time can be in the range of 2-12 hours. For example, a delay in the second semiconductor fabrication apparatus being ready to receive a semiconductor structure may increase the risk of oxidation of the top electrode 302 after removal from the first semiconductor fabrication apparatus and/or cause a delay in removing a semiconductor structure from the first semiconductor fabrication apparatus.

The gaps 308 may provide diffusion paths for chemistries used in semiconductor fabrication sequences of the fabrication of the semiconductor structure 300 subsequent to forming the top electrode 302 on the dielectric material 304 to reach the dielectric material 304. Chlorine species, for example, may damage the dielectric material 304 resulting in decreased capacitance of and/or increased current leakage in a memory cell including the top electrode 302 and the dielectric material 304.

Figure 4:
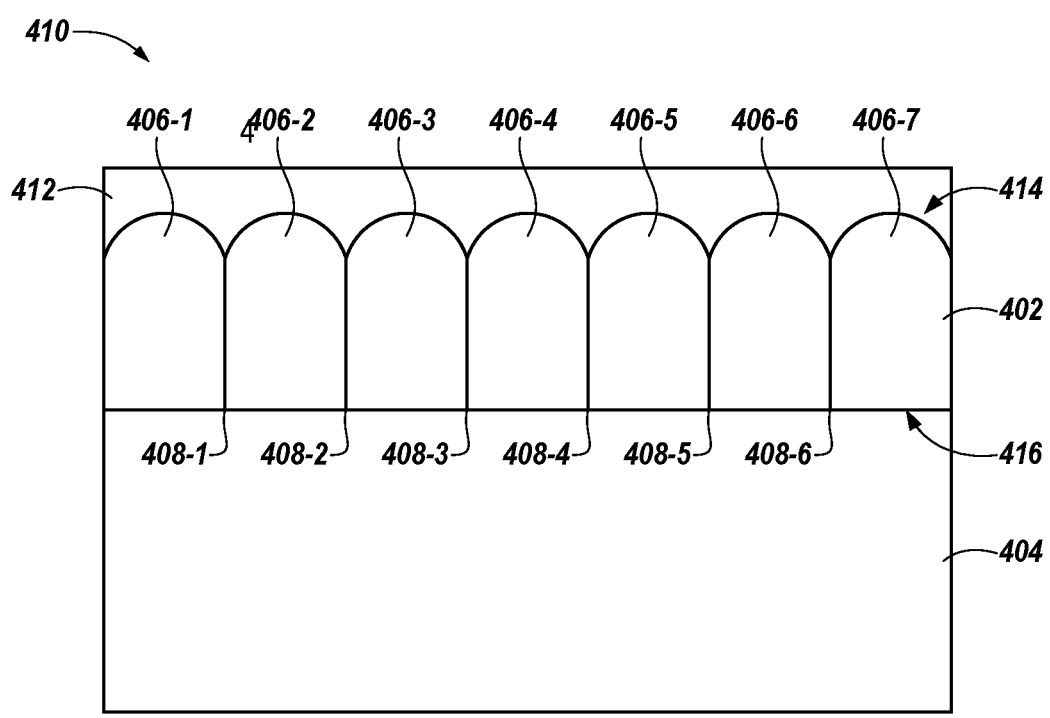
FIG. 4 illustrates a cross-sectional view of a working surface of a semiconductor structure including a barrier material at a point in time in a semiconductor fabrication sequence in accordance with a number of embodiments of the present disclosure.

FIG. 4 illustrates a cross-sectional view of a working surface of a semiconductor structure 410 including a barrier material 412 at a point in time in a semiconductor fabrication sequence in accordance with a number of embodiments of the present disclosure The point of time illustrated in FIG. 4 can be subsequent to the point in time illustrated in FIG. 3. The top electrode 402, grains 406, gaps 408, and dielectric material 404 can be analogous to the top electrode 302, grains 306, gaps 308, and dielectric material 304, respectively, described in association with FIG. 3. The barrier material 412 can be analogous to the barrier material 115 and 215 described in association with FIGS. 1A-2.

In at least one embodiment, the top electrode 402 can be formed by atomic layer deposition (ALD). The barrier material 412 can be formed in-situ on the top electrode 402 in the same semiconductor chamber in which the top electrode 402 is formed on the dielectric material 404. However, embodiments of the present disclosure are not so limited. As illustrated in FIG. 4, the barrier material 412 is formed on a top surface 414 of the top electrode 402.

In at least one embodiment, the barrier material 412 can be a silicon barrier material 412 formed by performing a silane soak of the top electrode 402. As used herein, "silane soak" refers to an exposure of a semiconductor structure to a silane-based gas. Examples of a silane-based gas include, but are not limited to, monosilane, disilane, dichlorosilane (DCS), trichlosilane (TCS), tris(dimethylamino)silane (3DMAS), tetrakis(dimethylamino)silane (4DMAS), and a tetraethyl silane diamine. In at least one embodiment, subsequent to the silane soak of the top electrode 402, the top electrode can be exposed to a nitride precursor. Non-limiting examples of a nitride precursor include ammonia, hydrazine, and amino derivatives. In at least one embodiment, forming the silicon nitride barrier material 412 can include at least one cycle of: exposing the top electrode 402 to a silicon precursor (e.g., a silane-based gas) in a semiconductor processing apparatus, purging the silicon precursor from the semiconductor processing apparatus, exposing the top electrode 402 to a nitride precursor, and purging the nitride precursor from the semiconductor processing apparatus. In at least one embodiment where the top electrode 402 comprises a nitride material (e.g., titanium nitride), each cycle of a plurality of cycles of exposing the top electrode 402 to a silane-based gas can form a sub-monolayer of a silicon nitride barrier material.

A silane soak of the top electrode 402 can form a sub-monolayer of a silicon nitride barrier material on the top surface 414 of the top electrode 402. A plurality of silane soaks can be used to form a monolayer of the silicon nitride barrier material. Each silane soak can be used to form a plurality of sub-monolayers of the silicon nitride barrier material, one on top of another. For example, a plurality of silane soaks can be used to form a monolayer of the silicon nitride material that is approximately 0.1 to 5 angstroms thick on the top surface 414 of the top electrode 402.

In at least one embodiment, forming the silicon barrier material 412 via a silane soak can be a self-limiting process. In a non-self-limiting process, for example, a silicon precursor, such as a silane-based gas, may continue to decompose and form a silicon barrier material on a substrate material even if all the active sites have had the silicon barrier material formed thereon. In contrast, forming the silicon barrier material 412 via one or more cycles of a silane soak as described herein can be a self-limiting process because there is a thermal window in which the silane-based gas will decompose (e.g., in a range of 150° C. to 700° C. depending on silicon precursor) and the silicon barrier material 412 will only be formed on active sites. Thus, formation of the silicon barrier material 412 does not run away. As such, a thin and controllable amorphous barrier material 412 can be formed on the top electrode 402.

In contrast to some previous approaches that include reducing queue time between forming the top electrode 402 on the dielectric material 404 in a first semiconductor fabrication apparatus and a subsequent processing step performed in a second semiconductor fabrication apparatus, the barrier material 412 can serve as a barrier to oxidization of the top electrode 402. Thus, constraints on the queue time can be relaxed, or even eliminated, because the barrier material 412 can protect the underlying top electrode 402 from oxygen.

As illustrated in FIG. 4, the barrier material 412 can at least partially fill in the gaps 408 between the grain boundaries of the grains 406 of the top electrode 402 and/or amorphizes the top surface 414 of the top electrode 402. In contrast, to the structured, granular nature of the material comprising the top electrode 402, the barrier material 412 can be amorphous, thereby preventing access to the gaps 408 between the grain boundaries of the grains 406 of the material comprising the top electrode 402. Thus, in contrast to some previous approaches, in at least one embodiment, the barrier material 412 blocks off diffusion paths, such as the gaps 408, through the top electrode 402 to the dielectric material 404 that may have been available for chemistries used in subsequent semiconductor fabrication sequences. As a result, the barrier material 412 can protect the dielectric material 404 from oxygen scavenging by chemistries used in subsequent semiconductor fabrication sequences. Scavenging of oxygen from a dielectric material can cause cell leakage of a storage node of a memory cell including the dielectric material. For example, the dielectric material 404 can be damaged by chlorine species used in subsequent semiconductor fabrication sequences, resulting in decreased cell capacitance and/or cell leakage. The barrier material 412 can protect the dielectric material 404 from chlorine attack from reactive gases used in subsequent semiconductor fabrication sequences. The barrier material 412 can protect the dielectric material 404 from boron diffusion from subsequent semiconductor fabrication sequences diffusing to the dielectric material 404 through the gaps 408, which can cause cell leakage. Thus, the barrier material 412 can minimize or prevent a decrease in cell capacitance and/or reduce cell leakage relative to previous approaches.

Although not shown in FIG. 4, a portion of the silicon barrier material 412 may oxidize ex-situ the semiconductor fabrication apparatus and form a silicon oxide material. The silicon oxide material formed on the silicon barrier material 412 can serve as another barrier material to oxidation of the top electrode 402. Oxygen may be caught in the silicon barrier material 412, thereby preventing oxygen from reaching and oxidizing the top electrode 402.

The top surface 414 of the top electrode 402 can have irregularities. The irregularities can cause a wide variance in the electrical resistivity of an electrode comprising the top electrode 402. A surface of the barrier material 412 can be more uniform than the surface 414. The more uniform surface of the barrier material 412 can result in a narrower variance (e.g., reduced variability) in the electrical resistivity of an electrode comprising the top electrode 402 with the barrier material 412 formed thereon.

Figure 5A:
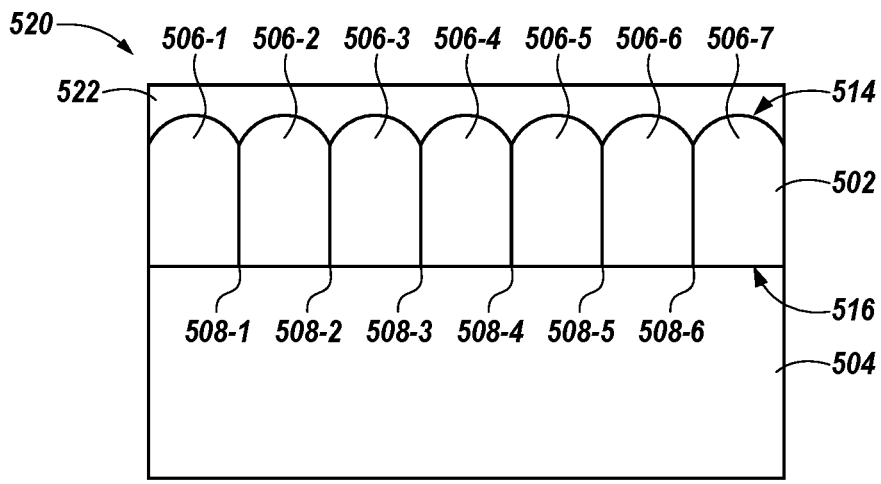
FIGS. 5A-5C illustrate cross-sectional views of a working surface of semiconductor structures including a barrier material at points in time in a semiconductor fabrication sequence in accordance with a number of embodiments of the present disclosure.
Figure 5B:
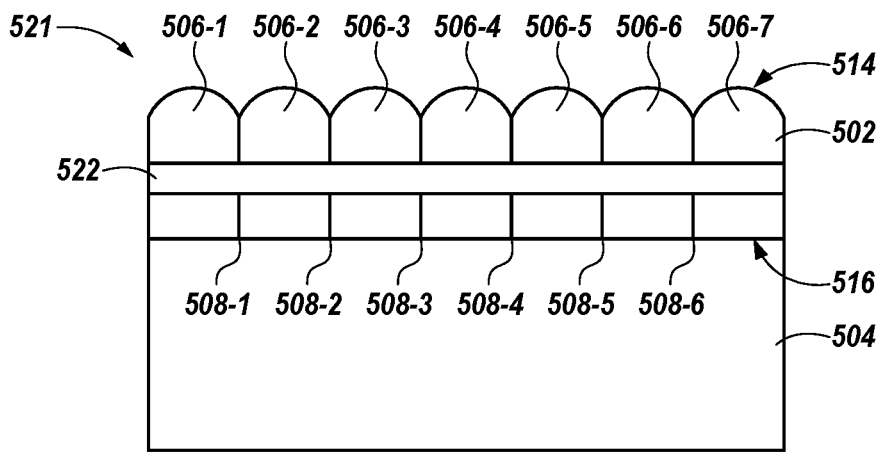
Figure 5C:
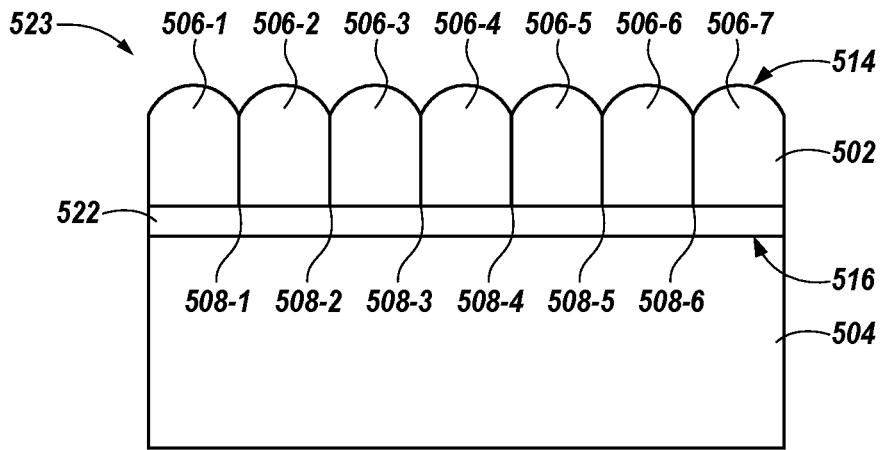

FIGS. 5A-5C illustrate cross-sectional views of a working surface of semiconductor structures 520, 521, and 523 including a barrier material 522 at points in time in a semiconductor fabrication sequence in accordance with a number of embodiments of the present disclosure. The top electrode 502, grains 506, gaps 508, and dielectric material 504 can be analogous to the top electrode 402, grains 406, and gaps 408, respectively, described in association with FIG. 4. The barrier material 522 can be analogous to the barrier material 115 and 215 described in association with FIGS. 1A-2.

In contrast to the exemplary embodiment described in association with FIG. 4, in the exemplary embodiments described in association with FIGS. 5A-5C, the barrier material 522 is formed via doping the top electrode 502 using a precursor during formation of the top electrode 502. The precursor can include, but is not limited to, a silicon (Si) precursor, a boron (B) precursor, a zirconium (Zr) precursor, a hafnium (Hf) precursor, a germanium (Ge) precursor, an aluminum (Al) precursor, a gallium (Ga) precursor, a carbon (C) precursor, a tungsten (W) precursor, a tungsten silicide (WSi) precursor, a titanium silicide (TiSi) precursor, a tungsten carbide (WC) precursor, and a tungsten boride (WB) precursor. Non-limiting examples of a boron precursor can include borane ($BH_3$), diborane ($B_2H_6$), boron trifluoride ($BF_3$), and boron tribromide ($BBr_3$). Non-limiting examples of an aluminum precursor can include trimethylaluminum (TMA) and aluminum chloride ($AlCl_3$). Non-limiting examples of a carbon precursor can include methane ($CH_4$), ethane ($C_2H_6$), propane ($C_3H_8$), and acetylene ($C_2H_2$). A non-limiting example of a tungsten precursor can be tungsten hexafluoride ($WF_6$).

In at least one embodiment of the present disclosure, the top electrode 502 can be a titanium nitride material. The titanium nitride material can be formed by ALD. For example, the titanium nitride material can be formed using a titanium nitride ALD scheme. In at least one embodiment, the titanium nitride ALD scheme can be a T-N ALD scheme; however, embodiments of the present disclosure are not so limited. The T-N ALD scheme can include a titanium precursor being introduced into a semiconductor fabrication apparatus (T) and then the semiconductor fabrication apparatus can be purged. Subsequently, a nitrogen precursor can be introduced into the semiconductor fabrication apparatus (N) and then the semiconductor fabrication apparatus can be purged. Non-limiting examples of a nitride precursor include ammonia, hydrazine, and amino derivatives.

Before an introduction of the nitrogen precursor into the semiconductor fabrication apparatus or after a purge of the nitrogen precursor from the semiconductor fabrication apparatus, the precursor can be introduced into the semiconductor fabrication apparatus. For example, a silicon precursor can be introduced into a semiconductor fabrication apparatus housing the dielectric material 504 during forming the top electrode 502. The silicon precursor can be introduced into the semiconductor fabrication apparatus at a flowrate of approximately 1 to 1,000 standard cubic centimeter per minute (sccm). The silicon precursor can be introduced into a semiconductor fabrication apparatus for up to approximately 120 seconds, for example. The silicon precursor can be introduced into a semiconductor fabrication apparatus at a temperature range of approximately 150° C. to 700° C.

Forming the top electrode 502 can include a plurality of cycles of a titanium nitride ALD scheme. Controlling when during forming the top electrode 502 the precursor is introduced into the semiconductor fabrication apparatus controls the position within or on the top electrode 502 at which the barrier material 522 is formed. FIG. 5A illustrates a cross-sectional view of the semiconductor structure 520 in which the barrier material 522 is formed near or on a top surface 514 of the top electrode 502. FIG. 5B illustrates a cross-sectional view of the semiconductor structure 521 in which the barrier material 522 is formed within the top electrode 502. FIG. 5C illustrates a cross-sectional view of the semiconductor structure 523 in which the barrier material 522 is formed near an interface 516 of the top electrode 502.

Controlling the position of the nitride material 522 within or on the top electrode 502 as illustrated in FIGS. 5A-5C can tune performance of a storage node (e.g., the capacitors 130, 132, and 134 described in association with FIGS. 1A-1C) of a memory cell including the top electrode 502 as an electrode of the storage node and the dielectric material 504 as a storage node material. Non-limiting examples of performance factors of a storage node that can be tuned by controlling the position of the nitride material 522 within or on the top electrode 502 include cell leakage, cell resistance, and breakdown voltage. For example, forming the barrier material 522 near the interface 516 of the semiconductor structure 523 as illustrated in FIG. 5C can result in a greater reduction in cell leakage than forming the barrier material 522 in the middle of the top electrode 502 of the semiconductor structure 521 as illustrated in FIG. 5B. Forming the barrier material 522 in the middle of the top electrode 502 of the semiconductor structure 521 as illustrated in FIG. 5B can result in a higher breakdown voltage than forming the barrier material 522 near the interface 516 of the semiconductor structure 523 as illustrated in FIG. 5C.

In the exemplary embodiment illustrated in FIG. 5A, the precursor is introduced into the semiconductor fabrication apparatus during the formation of the top electrode 502 such that the barrier material 522 is formed near the top surface 514 of the top electrode 502 as opposed to near the interface 516 of the top electrode 502 and the dielectric material 504. For example, a silicon precursor can be introduced during one or more of the final cycles of the T-N ALD scheme described herein such that the barrier material 522 is formed near the top surface 514 of the top electrode 502. A cycle of introducing the silicon precursor can include introducing the silicon precursor into the semiconductor fabrication apparatus, purging the semiconductor fabrication apparatus, introducing a nitrogen precursor into the semiconductor fabrication apparatus, and purging the semiconductor fabrication apparatus. Although not specifically illustrated in FIG. 5A, a layer of the top electrode 502 can be formed on the barrier material 522 when at least one cycle of ALD of the top electrode 502 follows introduction of the precursor into the semiconductor fabrication apparatus.

In the exemplary embodiment illustrated in FIG. 5B, the precursor is introduced into the semiconductor fabrication apparatus during the formation of the top electrode 502 such that the barrier material 522 is formed approximately in the middle of the top electrode 502 as opposed to near the top surface 514 of the top electrode 502 or the interface 516 of the top electrode 502 and the dielectric material 504. For example, a silicon precursor can be introduced during one or more of cycles of the T-N ALD scheme described herein halfway through forming a titanium nitride material on the dielectric material 504 such that the barrier material 522 is formed within the titanium nitride material. As such, a first deposition of a material comprising the top electrode 502 can be formed on the dielectric material 504 and the barrier material 522 can be formed on the first deposition of the material comprising the top electrode 502. A second deposition of the material comprising the top electrode 502 can be formed on the barrier material 522.

In the exemplary embodiment illustrated in FIG. 5C, the precursor is introduced into the semiconductor fabrication apparatus during the formation of the top electrode 502 so that the barrier material 522 is formed approximately near the interface 516 between the top electrode 502 and the dielectric material 504 as opposed to the surface 514. For example, the silicon precursor can be introduced during one or more of initial cycles of the T-N ALD scheme described herein so that the barrier material 522 is formed near the interface 516 of the titanium nitride material and the dielectric material 504. Although not specifically illustrated in FIG. 5C, a layer of the top electrode 502 can be formed on a layer of the top electrode 502 between the dielectric material 504 and the barrier material 522 when at least one cycle of ALD of the top electrode 502 precedes introduction of the precursor into the semiconductor fabrication apparatus.

As described herein, the barrier material 522 can serve as a barrier to oxidization of the top electrode 502. As illustrated in FIGS. 5A-5C, the barrier material 522 can at least partially fill in the gaps 508 between the grain boundaries of the grains 506 of the top electrode 502. As illustrated in FIG. 5A, the barrier material 522 can at least partially fill in the gaps 508 and/or amorphize the top surface 514 of the top electrode 502. In contrast, to the structured, granular nature of the material comprising the top electrode 502 (e.g., a titanium nitride material), the barrier material 522 can be amorphous, thereby preventing access to the gaps 508 between the grain boundaries of the grains 506 of the material comprising the top electrode 502. As a result, the barrier material 522 can protect the dielectric material 504 from oxygen scavenging by chemistries used in subsequent semiconductor fabrication sequences. The barrier material 522 can protect the dielectric material 504 from chlorine attack from reactive gases used in subsequent semiconductor fabrication sequences. The barrier material 522 can protect the dielectric material 504 from boron diffusion from subsequent semiconductor fabrication sequences diffusing to the dielectric material 504 through the gaps 508, which can cause cell leakage. Thus, the barrier material 522 can minimize or prevent a decrease in cell capacitance, minimize or prevent an increase in cell resistance, reduce cell leakage, and/or improve breakdown voltage relative to previous approaches.

Although FIGS. 5A-5C show a single instance of the barrier material 522, at least one embodiment of the present disclosure can include more than one instance of the barrier material 522 formed at different locations on and/or within the top electrode 502. For example, at least one embodiment can include a first instance of the barrier material 522 formed on the top electrode 502 as described in association with FIG. 5A and a second instance of the barrier material 522 formed within the top electrode 502 as described in association with FIG. 5B. At least one embodiment can include multiple instances of the barrier material 522 formed a different locations within the top electrode 502 as described in association with FIG. 5B.

Figure 6:
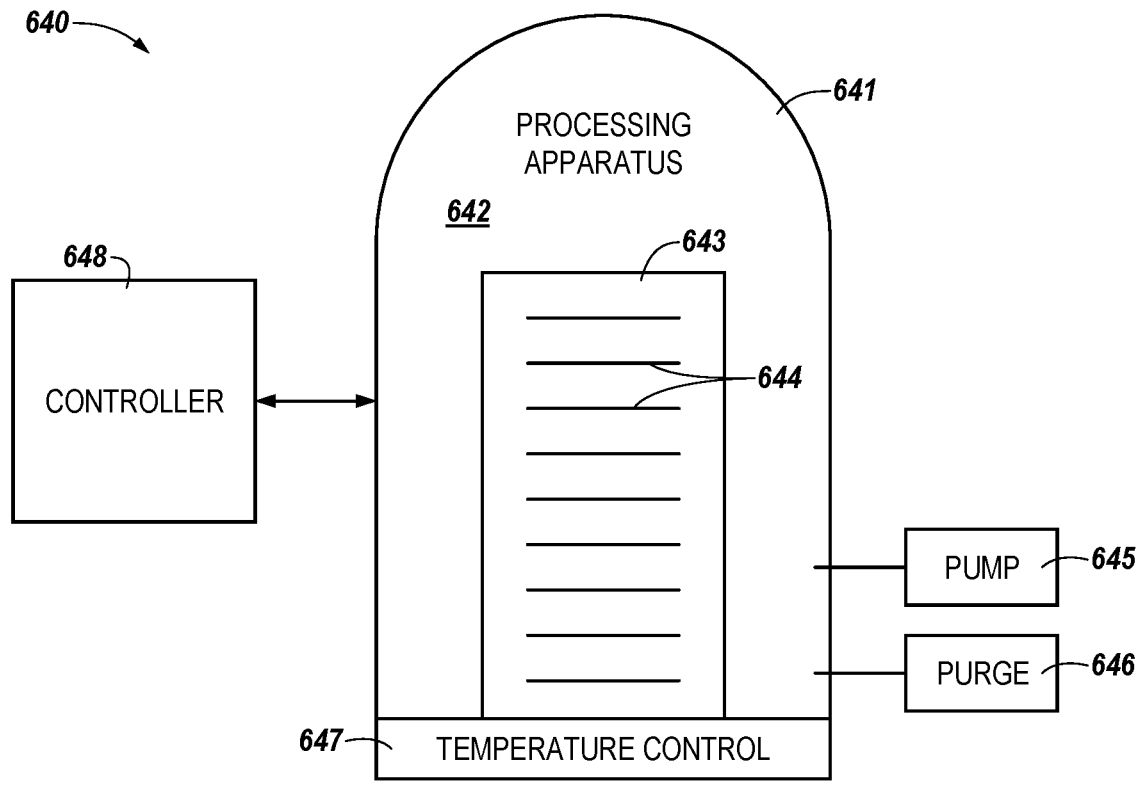
FIG. 6 is a functional block diagram of an apparatus for implementation of an example semiconductor fabrication sequence in accordance with a number of embodiments of the present disclosure.

FIG. 6 is a functional block diagram of an apparatus 640 for implementation of an example semiconductor fabrication sequence in accordance with a number of embodiments of the present disclosure. The system 640 can include a processing apparatus 641 (e.g., a semiconductor fabrication apparatus). The processing apparatus 641 can be configured to enable in-situ formation of a barrier material on a top electrode.

The processing apparatus 641 can include a semiconductor processing chamber 642 to enclose components configured to form, in-situ in a semiconductor processing chamber 642, a barrier material (e.g., the barrier material 115, 215, 412, and 522 described in association with FIGS. 1A-2 and 4-5C) on a top electrode (e.g., the top electrode 102, 202, 302, 402, and 502 described in association with FIGS. 1A-5C). The semiconductor processing chamber 642 can further enclose a carrier 643 to hold a batch of semiconductor wafers 644 including a top electrode. The processing apparatus 641 can include and/or be associated with tools including, for example, a pump unit 645 and a purge unit 646 configured to introduce and remove precursors as described herein to form a barrier material on a top electrode. In at least one embodiment, the processing apparatus 641 can include and/or be associated with tools including, for example, a pump unit 645 and a purge unit 646 configured to introduce and remove precursors as described herein to form a top electrode and a barrier material on the top electrode. The processing apparatus 641 can further include a temperature control unit 647 configured to maintain the semiconductor processing chamber 642 at an appropriate temperature as described herein (e.g., between approximately 150° C. and approximately 700° C.).

The system 640 can further include a controller 648. The controller 648 can include, or be associated with, circuitry and/or programming for implementation of, for instance, in-situ formation of a barrier material on a top electrode. Adjustment of such deposition and purging operations by the controller 648 can control the thickness of the barrier material and/or position of the barrier material within or on the top electrode as described herein.

The controller 648 can, in a number of embodiments, be configured to use hardware as control circuitry. Such control circuitry can, for example, be an application specific integrated circuit (ASIC) with logic to control fabrication steps, via associated deposition and purge processes, for in-situ formation of a barrier material on a top electrode.

Figure 7:
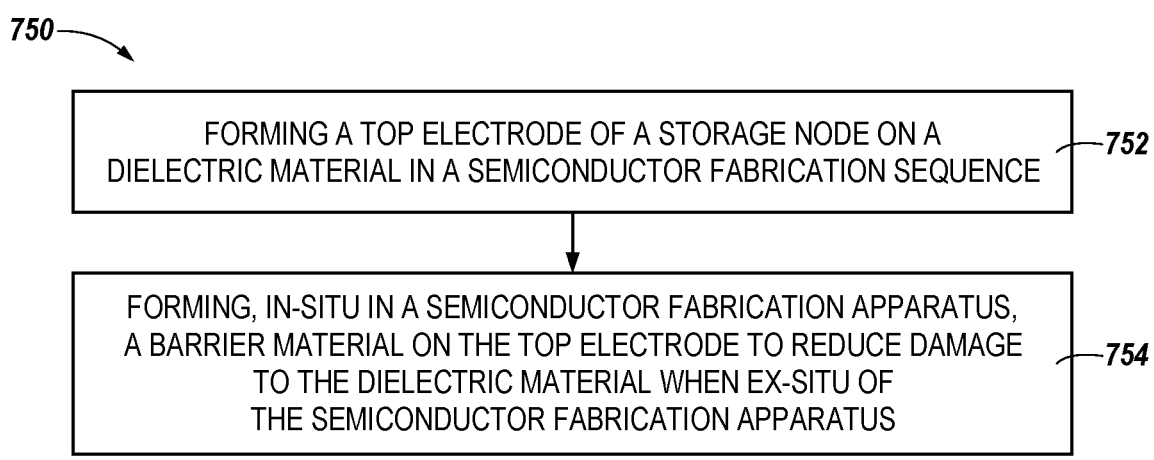
FIG. 7 is a flow diagram of an example method for forming a barrier material in accordance with a number of embodiments of the present disclosure.

FIG. 7 is a flow diagram of an example method 750 for forming a barrier material on a top electrode in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 752, the method 750 can include forming a top electrode of a storage node on a dielectric material in a semiconductor fabrication sequence. At block 754, the method 750 can include forming, in-situ in a semiconductor fabrication apparatus, a barrier material on the top electrode to reduce damage to the dielectric material when ex-situ of the semiconductor fabrication apparatus.

In at least one embodiment, the method can include forming the barrier material on the top electrode to reduce oxidation of the top electrode when ex-situ of the semiconductor fabrication apparatus. In at least one embodiment, forming the barrier material can include forming a silicon barrier material on the top electrode. Forming the silicon barrier material can include exposing the top electrode to a silicon precursor. Exposing the top electrode to the silicon precursor can include exposing the top electrode to a silane-based gas. Exposing the top electrode to the silane-based gas can include a plurality of cycles of exposing the top electrode to the silane-based gas, each cycle forming a sub-monolayer of the silicon barrier material. In at least one embodiment, forming the barrier material can include forming a nitride barrier material on the top electrode. In at least one embodiment, forming the barrier material can include forming a boron barrier material on the top electrode. Forming the boron barrier material can include exposing the top electrode to a boron precursor. In at least one embodiment, forming the barrier material can include forming an aluminum barrier material on the top electrode. Forming the aluminum barrier material can include exposing the top electrode to an aluminum precursor. Forming the barrier material can include forming a carbide barrier material on the top electrode. Forming the carbide barrier material can include exposing the top electrode to a carbon precursor.

Although not specifically illustrated, an example method for forming a silicon barrier material on a top electrode in accordance with a number of embodiments of the present disclosure can include forming a top electrode of a storage node on a dielectric material in a semiconductor fabrication sequence and forming, in-situ in a semiconductor fabrication apparatus, a silicon barrier material on the top electrode to reduce damage to the dielectric material when ex-situ of the semiconductor fabrication apparatus. In at least one embodiment, forming the top electrode can include forming a first portion of the top electrode and forming the silicon barrier material can include forming the barrier material on the first portion of the top electrode. The method can further include forming a second portion of the top electrode such that the silicon barrier material is formed between the first and second portions of the top electrode. In at least one embodiment, forming the top electrode can include forming the top electrode to a thickness that is in a range of 10 angstroms to 60 angstroms. Forming the silicon nitride material can include forming the silicon barrier material to a thickness that is in a range of 0.1 angstroms to 5 angstroms. Forming the silicon barrier material comprises a plurality of cycles of exposing the top electrode to a silane-based gas, each cycle forming a sub-monolayer of the silicon barrier material. In at least one embodiment, forming the silicon barrier material can include ALD of the silicon barrier material on the top electrode. The method can further include exposing the top electrode to a silicon precursor and heating the semiconductor fabrication apparatus to a temperature in a range of approximately 150° C. and 700° C. The method can further include introducing a silicon precursor into the semiconductor fabrication apparatus at a flowrate in a range of approximately 1 sccm and 1,000 sccm. In one example, the method can further include exposing the top electrode to a silicon precursor for at most approximately 120 seconds.

Figure 8:
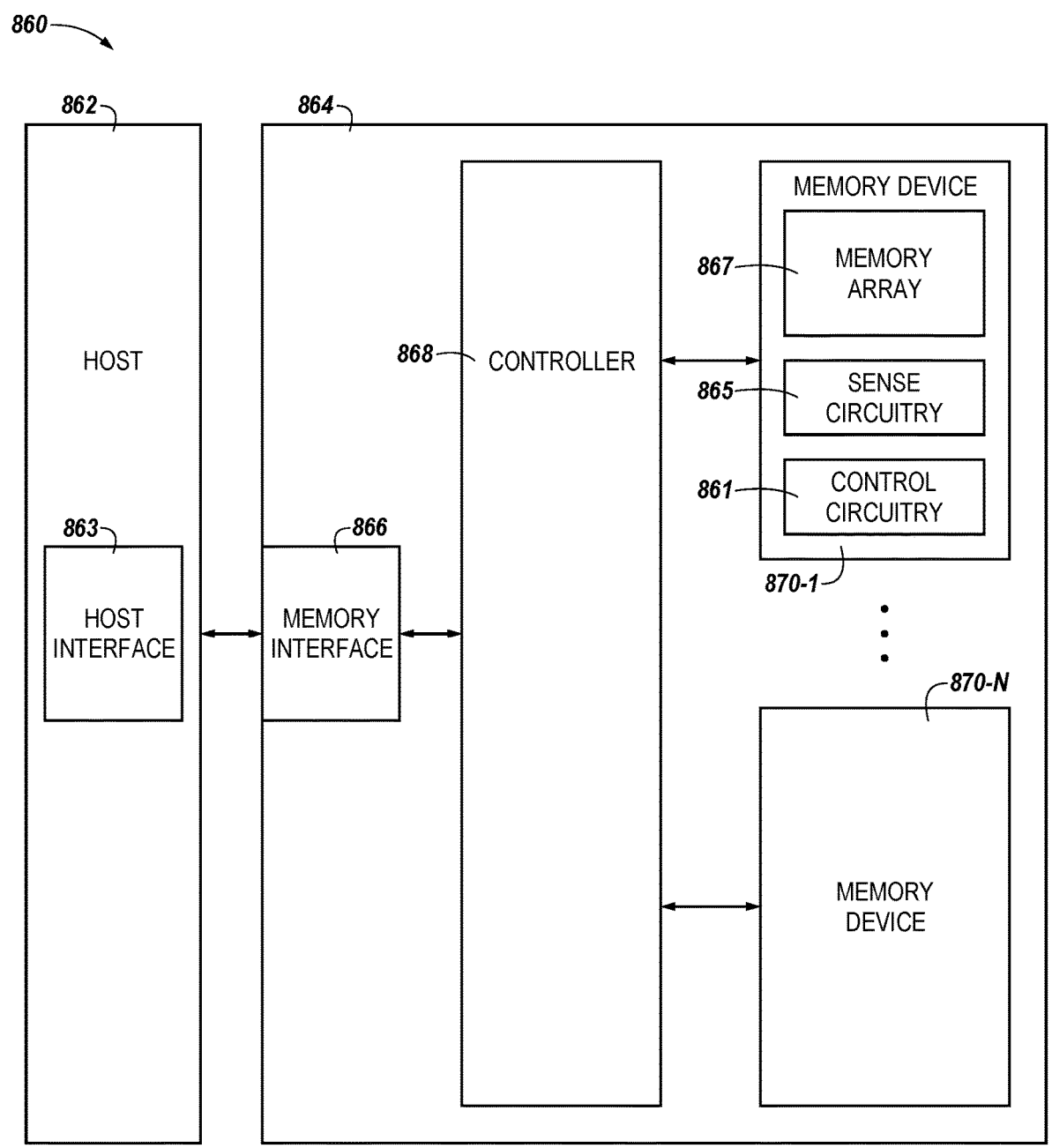
FIG. 8 illustrates a functional block diagram of a computing system including at least one memory array having a structure formed in accordance with a number of embodiments of the present disclosure.

FIG. 8 is a functional block diagram of a computing system 860 including at least one memory array having a structure formed in accordance with a number of embodiments of the present disclosure. In the example illustrated in FIG. 8, the system 864 includes a memory interface 866, a number of memory devices 870-1, . . . , 870-N, and a controller 868 selectably coupled to the memory interface 866 and memory devices 870-1, . . . , 870-N. The system 864 can be, for example, a solid-state drive (SSD). The memory interface 866 can be used to communicate information between the system 860 and another device, such as a host 862. The host 862 can include a processor (not shown). As used herein, "a processor" can be a number of processors, such as a parallel processing system, a number of coprocessors, etc. Example hosts can include, or by implemented in, laptop computers, personal computers, digital cameras, digital recording devices and playback devices, mobile telephones, PDAs, memory card readers, interface hubs, and the like.

In a number of examples, the host 862 can be associated with (e.g., include or be coupled to) a host interface 863. The host interface 863 can enable input of scaled preferences (e.g., in numerically and/or structurally defined gradients) to define, for example, critical dimensions (CDs) of a final structure or intermediary structures of a memory device (e.g., the memory device 870-1) and/or an array of memory cells (e.g., the memory array 867) formed thereon to be implemented by the processing apparatus. The scaled preferences can be provided to the host interface 863 via input of a number of preferences stored by the host 862, input of preferences from another storage system (not shown), and/or input of preferences by a user (e.g., a human operator).

The memory interface 866 can be in the form of a standardized physical interface. For example, when the system 864 is used for information (e.g., data) storage in computing system 860, the memory interface 866 can be a serial advanced technology attachment (SATA) interface, a peripheral component interconnect express (PCIe) interface, or a universal serial bus (USB) interface, among other physical connectors and/or interfaces. In general, however, the memory interface 866 can provide an interface for passing control, address, information, scaled preferences, and/or other signals between a controller 868 of the system 864 and the host 862 (e.g., via host interface 863).

The controller 868 can include, for example, firmware and/or control circuitry (e.g., hardware). The controller 868 can be operably coupled to and/or included on the same physical device (e.g., a die) as one or more of the memory devices 870-1, . . . , 870-N. For example, the controller 868 can be, or can include, an ASIC as hardware operably coupled to circuitry (e.g., a printed circuit board) including the memory interface 866 and the memory devices 870-1, . . . , 870-N. Alternatively, the controller 868 can be included on a separate physical device that is communicatively coupled to the physical device (e.g., the die) that includes one or more of the memory devices 870-1, . . . , 870-N.

The controller 868 can communicate with the memory devices 870-1, . . . , 870-N to direct operations to sense (e.g., read), program (e.g., write), and/or erase information, among other functions and/or operations for management of memory cells. The controller 868 can have circuitry that can include a number of integrated circuits and/or discrete components. In a number of examples, the circuitry in controller 868 can include control circuitry for controlling access across the memory devices 870-1, . . . , 870-N and/or circuitry for providing a translation layer between the host 862 and the system 864.

The memory devices 870-1, . . . , 870-N can include, for example, a number of memory arrays 867 (e.g., arrays of volatile and/or non-volatile memory cells). For instance, the memory devices 870-1, . . . , 870-N can include arrays of memory cells that include structures described in connection with FIGS. 1A-2 and 4-5C. As will be appreciated, the memory cells in the memory array 867 of the memory devices 870-1, . . . , 870-N can be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture including a barrier material formed in-situ on a top electrode as described herein.

The memory devices 870-1, . . . , 870-N can be formed on the same die. A memory device (e.g., the memory device 870-1) can include one or more of the array of memory cells 867 formed on a die. The memory device 870-1 can include sense circuitry 865 and control circuitry 861 associated with one or more memory arrays 867 formed on the die, or portions thereof. For example, the sense circuitry 865 can be utilized to determine (sense) a particular data value (e.g., 0 or 1) that is stored at a particular memory cell in a row of an array 867. The control circuitry 861 can be utilized to direct the sense circuitry 865 to sense particular data values, in addition to directing storage, erasure, etc., of data values in response to a command from the host 862 and/or the host interface 863. The command can be sent directly to the control circuitry 861 via the memory interface 866 or to the control circuitry 861 via the controller 868.

The example illustrated in FIG. 8 can include additional circuitry that is not illustrated so as not to obscure examples of the present disclosure. For example, the memory devices 870-1, . . . , 870-N can include address circuitry to latch address signals provided over I/O connectors through I/O circuitry. Address signals can be received and decoded by a row decoder and a column decoder to access the memory array 867. It will be appreciated that the number of address input connectors can depend on the density and/or architecture of the memory devices 870-1, . . . , 870-N and/or the memory arrays 867.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example embodiments including various combinations and configurations of semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches, among other materials and/or components related to determining overlay of features of a memory array, have been illustrated and described herein, embodiments of the present disclosure are not limited to those combinations explicitly recited herein. Other combinations and configurations of the semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches related to determining overlay of features of a memory array than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
    forming, in-situ a semiconductor processing chamber of a semiconductor fabrication apparatus, a top electrode of a storage node on a dielectric material in a semiconductor fabrication sequence, wherein the top electrode comprises a titanium nitride material having a first maximum thickness of 60 angstroms; and
    forming, in-situ the semiconductor processing chamber, a barrier material on the top electrode to reduce oxidation of the top electrode and damage to the dielectric material when ex-situ the semiconductor fabrication apparatus,
    wherein the barrier material has a second maximum thickness of 5 angstroms,
    wherein the barrier material at least partially fills a gap between grain boundaries of the titanium nitride material of the top electrode to block diffusion paths to the dielectric material to reduce damage to the dielectric material during subsequent processing of the storage node, and
    wherein forming the barrier material comprises forming a silicon barrier material on the top electrode via a self-limiting process that includes exposing the top electrode to a silane-based gas.

2. The method of claim 1, wherein forming the barrier material further comprises forming a silicon nitride barrier material on the top electrode.

3. A method, comprising:
    forming, in-situ a semiconductor processing chamber of a semiconductor fabrication apparatus, a first portion of a top electrode of a storage node on a dielectric material;
    forming, in-situ the semiconductor processing chamber, a silicon nitride barrier material on the top electrode to reduce oxidation of the top electrode and damage to the dielectric material when ex-situ the semiconductor fabrication apparatus,
    wherein forming the silicon nitride barrier material comprises:
        exposing the top electrode to a silicon precursor; and
        exposing the top electrode to a nitride precursor;

prior to forming the silicon nitride barrier material, heating the semiconductor processing chamber to a temperature in a range of 150° C. to 295° C. or 655° C. to 700° C.; and forming, in-situ the semiconductor processing chamber, a second portion of the top electrode such that the silicon nitride barrier material is formed between the first and second portions of the top electrode, wherein the silicon nitride barrier material has a thickness that is in a range of 0.1 angstroms to 5 angstroms, wherein a cumulative thickness of the first portion of the top electrode, the silicon nitride barrier material, and the second portion of the top electrode is in a range of 10 angstroms to 60 angstroms, and wherein the silicon nitride barrier material at least partially fills a gap between grain boundaries of the titanium nitride material of the top electrode to block diffusion paths to the dielectric material to reduce damage to the dielectric material during subsequent processing of the storage node.

4. The method of claim 3, wherein forming the silicon nitride barrier material comprises a plurality of cycles of exposing the top electrode to a silane-based gas, each cycle forming a sub-monolayer of the silicon nitride barrier material.

5. The method of claim 3, further comprising introducing the silicon precursor into the semiconductor processing chamber at a flowrate in a range of 1 standard cubic centimeter per minute (sccm) and 1,000 sccm.

6. The method of claim 3, further comprising exposing the top electrode to the silicon precursor for at most 120 seconds.

7. A method, comprising:

forming, in-situ a semiconductor processing chamber of a semiconductor fabrication apparatus, a silicon nitride barrier material near an interface between a top electrode of a storage node and a dielectric material of the storage node to reduce damage to the dielectric material during subsequent processing of the storage node, wherein forming the silicon nitride barrier material comprises introducing a silicon precursor during a cycle of a titanium nitride (T-N) atomic layer deposition (ALD) scheme of forming the top electrode, and wherein the silicon nitride barrier material at least partially fills a gap between grain boundaries of the top electrode to block diffusion paths to the dielectric material to reduce damage to the dielectric material during subsequent processing of the storage node; and forming, in-situ the semiconductor processing chamber and using the T-N ALD scheme, the top electrode on the dielectric material.

8. The method of claim 7, forming the silicon nitride barrier material to a thickness in a range of 0.1 angstroms to 5 angstroms.

9. The method of claim 8, forming the top electrode to a thickness in a range of 10 angstroms to 60 angstroms.

* * * * *